INVENTOR:
JEFFREY B. CUNNANE
BY
George M. Gould
ATTORNEY

Feb. 6, 1973 J. B. CUNNANE 3,715,258

INTEGRATED CIRCUIT DIE BONDING APPARATUS

Filed March 23, 1971 2 Sheets-Sheet 2

United States Patent Office 3,715,258
Patented Feb. 6, 1973

3,715,258

INTEGRATED CIRCUIT DIE BONDING APPARATUS

Jeffrey B. Cunnane, Yonkers, N.Y., assignor to H. S. Bancroft Corporation, Cherry Hill, N.J.

Filed Mar. 23, 1971, Ser. No. 127,201
Int. Cl. B32b *31/20;* C09j *5/06*
U.S. Cl. 156—356 8 Claims

ABSTRACT OF THE DISCLOSURE

An apparatus for semi-automatically bonding integrated circuit dies to lead frames comprising adhesive dispensing means, die aligning means, die transport means and lead frame indexing means. In an operating cycle a metered drop of conductive adhesive is placed on a lead frame in a lead frame strip. The operator then microscopically aligns an integrated circuit die to a desired position and utilizes a vacuum arm to pick up the die and place it on the adhesive. Simultaneously adhesive is placed on the next lead frame which is then indexed into the operative position.

BACKGROUND OF THE INVENTION

Figure 1:
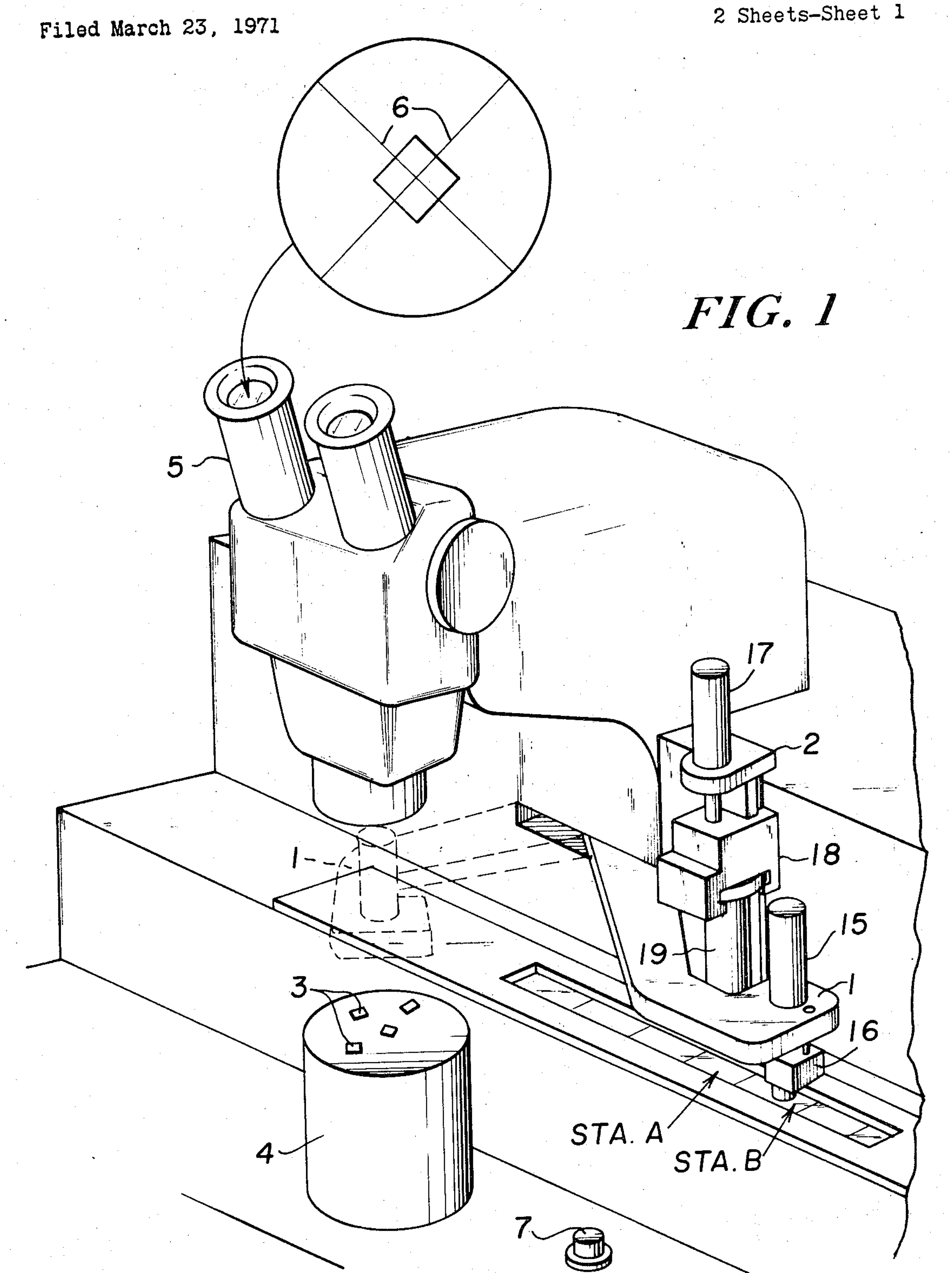

The rapidly expanding use of adhesive for integrated circuit die bonding has necessitated the development of an apparatus which will economically and accurately dispense such materials followed by exact placement of the die in proper alignment. Originally, integrated circuit die bonding was accomplished by gold plating the backs of the die and the lead frame and then fusing the two pieces together under extreme heat. While apparatus to accomplish heat bonding had been developed they were limited in economical usefulness by the fact that they could accommodate single lead frames only and could not be adapted to utilize lead frame strips. The use of adhesives has advanced the state of the art by opening up the possibility of low cost integrated circuit die bonding by obviating the need of the relatively expensive gold plating procedures. However, the full economic potential of this development has not heretofore been available to the art since adhesive bonding has been accomplished only by manual means. Up to the present no apparatus has been developed to allow the use of automated procedures for bonding integrated circuit dies to lead frame strips utilizing conductive adhesives.

BRIEF DESCRIPTION OF THE INVENTION

The present invention relates to a novel apparatus that provides semi-automatic adhesive bonding of integrated circuit dies to integrated circuit lead frames. In particular, the apparatus of the instant invention provides an improved means of dispensing and accurately placing a metered amount of adhesive material on an integrated circuit lead frame. Additionally, such apparatus provides means for selecting and aligning the dies as well as transporting the dies to said lead frames. The transport means is so constructed as to ensure that placement of the die on the adhesive material on the lead frame is done with conservation of the critical proper alignment.

The subject apparatus is comprised of four sub-components. A first sub-component consists of the alignment assembly. In a preferred embodiment the alignment assembly comprises a microscope having a cross-hairs sighting feature and a slidable pedestal on which integrated circuit dies that are to be bonded are held in readiness.

A second sub-component consists of the integrated circuit die transport means. In a preferred embodiment the transport means comprises a rotatably mounted arm support means and a peripherally mounted vacuum pick-up means. The driving force for the transport means most preferably can be derived from compressed air and thus the transport means will be operatively connected to a suitable source of compressed air, i.e., a compressed air line or cylinder.

The third sub-component of the subject apparatus comprises a lead frame escapement means. In a preferred embodiment such escapement means consists of a tracking means, a lead frame holding means and a lead frame indexing means. Most desirably the said lead frame holding means and lead frame indexing means are driven by either compressed air from a suitable line or cylinder source, by electric solenoids or by means of mechanical linkage from the aforesaid arm support means.

The fourth and final sub-component herein comprises an adhesive dispensing means which in a preferred embodiment consists of a disposable dispensing cartridge and an amount of preferably pre-packaged adhesive material; a slideably mounted manifold means support means which most desirably is mechanically driven, i.e., by air pressure; an electronic timing means and air pressure regulator means.

Figure 2:
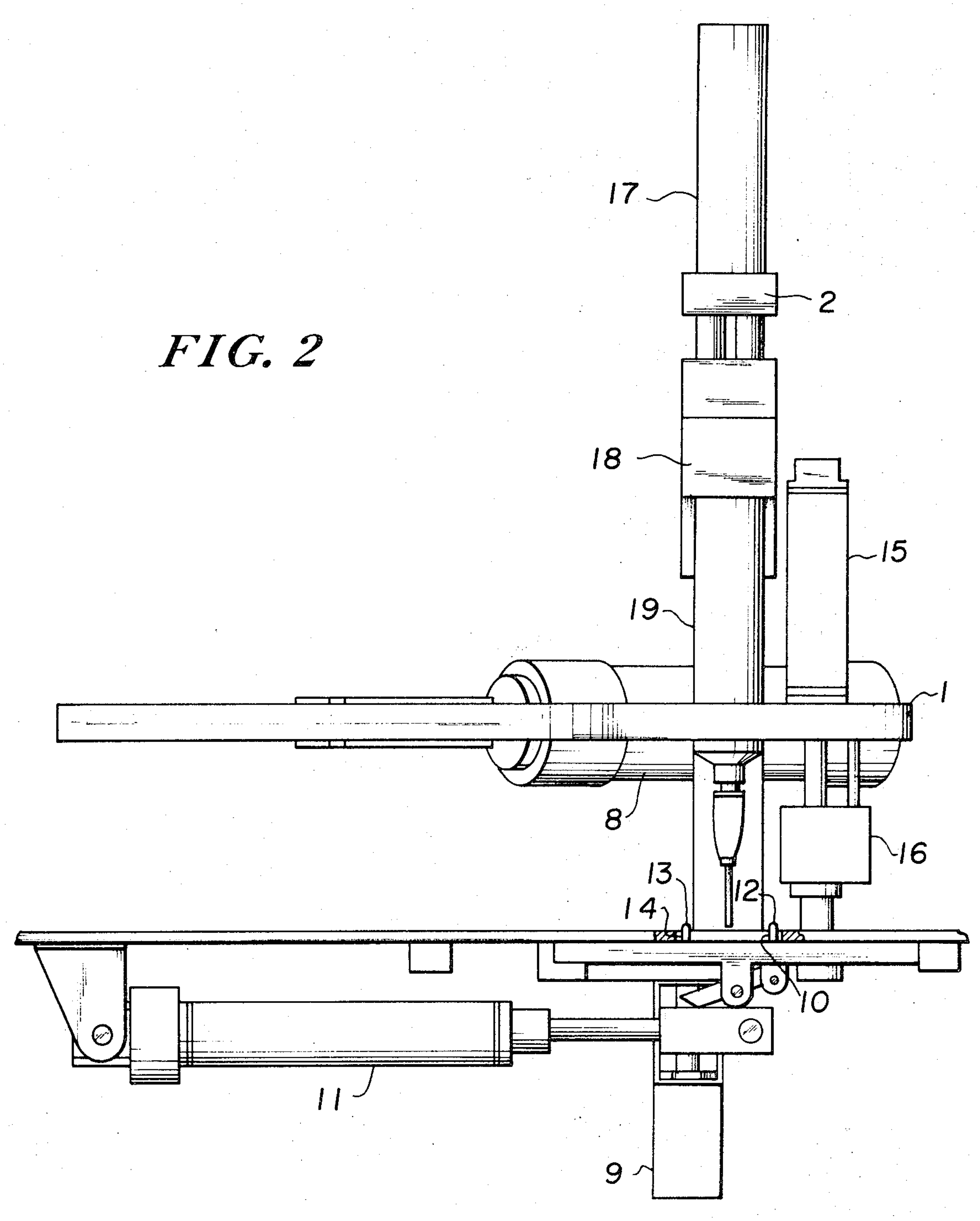

The apparatus of the present invention may be more clearly understood by reference to the accompanying drawings wherein FIG. 1 is a perspective view showing the entire apparatus while FIG. 2 provides a detail view of several of the subcomponents, i.e., transport means, lead frame escapement means and adhesive dispensing means.

Turning first to FIG. 1, arm support means 1 is shown in the retracted or "at rest" position. The adhesive dispensing means 2 has dispensed a metered amount of adhesive, preferably a conductive epoxy adhesive known in the art, on the lead frame occupying position STA. B while it was in position STA. A in the previous operating cycle. A random quantity of integrated circuit dies 3 have been placed on the slideable pedestal 4.

To begin an operating cycle the operator selects one of the dies 3 by sighting the die through microscope 5. Alignment of the die is facilitated by rotating or moving pedestal 4 in any desired manner until the desired die appears in the required relationship to the cross-hairs 6 in the microscope as indicated in the detail view in FIG. 1. Once the die is aligned to the operator's satisfaction, the operator depresses switch 7 which is preferably a foot activated switch which thereby starts the following automatic sequence of events (reference should now be made to FIG. 2 for the detailed description of the operation). Air cylinder 8 extends, thus moving arm support means 1 from its "at rest" position to a position above pedestal 4. Simultaneously solenoid 9 causes holding means 13 to retract from alignment hole 14 and air cylinder 11 extends causing lead frame indexing means 12 to engage opposite alignment hole 10 and thus indexes the frame from STA. A to STA. B with concomitant movement of one position in the entire lead frame strip.

Once arm support means 1 has attained its indicated second position, air cylinder 15 extends causing vacuum pick up means 16 to engage the desired die 3. Simultaneously, solenoid 9 extends causing holding means 13 to engage alignment hole 14. When air cylinder 15 is fully extended, a vacuum (from an external source not shown) is drawn through vacuum pick up means 16 against the upper surface of die 3 thereby holding the die to the said pick up means with preservation of the alignment of said die. Air cylinder 15 then retracts thereby lifting the desired die from pedestal 4. At the same time air cylinder 11 retracts thus disengaging and retracting lead frame indexing means 12.

At this point in time air cylinder 8 then begins to retract thus returning arm support means 1 to its "at rest position." Air cylinder 17 then extends thus lowering manifold means support means 18 and disposable cartridge 19 of adhesive dispenser means 2 to the proximity of the surface of the lead frame occupying position STA. A.

When arm support means 1 is in the "rest position" again, air cylinder 15 extends once more thus pressing die 3 lightly against surface of the lead frame in position STA. B and thereby seats the said die in an adhesive spot which had been dispensed during the previous operating cycle when the lead frame in position STA. B had been in position STA. A.

A column of carefully regulated air pressure is applied to adhesive dispenser cartridge 19 for a desired period of time to provide extrusion of a metered amount of adhesive. Control of the air pressure can be readily accomplished by means well known in the art, i.e., by utilizing an electronic timer means (not shown) which when energized will open a four way solenoid valve (not shown) for the desired period thereby allowing the indicated air pressure to be applied to said syringe 19 through manifold means support means 18.

When air cylinder 15 is fully extended, vacuum supply to vacuum pick up means 16 is interrupted. When both the vacuum supply to the vacuum pick up means 16 and the air supply to adhesive dispensing means 2 have been interrupted, air cylinders 15 and 17 retract and the apparatus is then ready to be recycled.

It is within the skill of the art to modify certain of the features enumerated with regard to the apparatus of the present invention. For example, the lead frames may be supplied either individually or in the form of coils by modifying the lead frame escapement means in a manner known per se. Furthermore, the lead frame tracking means contained in the lead frame escapement means can be modified in conventional manner to incorporate therein one or more heating elements for the purpose of curing the applied adhesive.

I claim:

1. An apparatus for adhesive die bonding of dies to lead frames comprising in combination:

(A) die alignment assembly means whereby a selected die in a randomly oriented group of dies is placed in desired alignment;

(B) die transport means whereby the said selected die is transported from said randomly oriented group of dies with conservation of the desired alignment;

(C) lead frame escapement means whereby a lead frame containing an adhesive spot is indexed into position to receive said selected die in desired alignment from said die transport means; and (D) adhesive dispensing means whereby said spot of adhesive is dispensed on said lead frame prior to its being indexed.

2. The apparatus of claim 1 wherein said die alignment assembly means comprises a microscope having a cross-hairs sight means and a slideable pedestal.

3. The apparatus of claim 1 wherein said die transport comprises a rotatably mounted arm support means and a peripherally mounted vacuum pick-up means.

4. The apparatus of claim 1 wherein said adhesive dispensing means comprises a disposable dispensing cartridge containing a pre-packaged adhesive material, and a slideably mounted manifold means support means.

5. The apparatus of claim 1 wherein said lead frame escapement means comprises a tracking means, a lead frame holding means and a lead frame indexing means.

6. The apparatus of claim 5 wherein said lead frame escapement means is a strip lead frame indexer.

7. The apparatus of claim 5 wherein said lead frame escapement means is a coil lead frame indexer.

8. The apparatus of claim 4 wherein said tracking means containing heating elements for the curing of adhesive applied to lead frames.

References Cited

UNITED STATES PATENTS

| | | | |
|---|---|---|---|
| 1,828,013 | 10/1931 | Yingling | 156—379 |
| 3,622,424 | 11/1971 | Mechel | 156—363 X |
| 2,739,628 | 3/1956 | Kok | 156—362 |
| 1,916,311 | 7/1933 | Hayden | 156—379 |
| 1,983,547 | 12/1934 | Knowlton | 156—578 X |
| 2,591,519 | 4/1952 | Decker | 156—379 |
| 3,480,504 | 11/1969 | Good et al. | 156—356 |
| 3,661,681 | 5/1972 | Edelberg et al. | 156—557 |

HAROLD ANSHER, Primary Examiner

U.S. Cl. X.R.

156—362, 379, 557, 578